(12) United States Patent
Muchherla et al.

(10) Patent No.: US 11,928,347 B2
(45) Date of Patent: *Mar. 12, 2024

(54) MANAGING VOLTAGE BIN SELECTION FOR BLOCKS OF A MEMORY DEVICE

(71) Applicant: Micron Technology, Inc., Boise, ID (US)

(72) Inventors: Kishore Kumar Muchherla, Fremont, CA (US); Mustafa N Kaynak, San Diego, CA (US); Peter Feeley, Boise, ID (US); Sampath K Ratnam, Boise, ID (US); Shane Nowell, Boise, ID (US); Sivagnanam Parthasarathy, Carlsbad, CA (US); Karl D Schuh, Santa Cruz, CA (US); Jiangang Wu, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/114,967

(22) Filed: Feb. 27, 2023

(65) Prior Publication Data
US 2023/0205438 A1    Jun. 29, 2023

Related U.S. Application Data

(63) Continuation of application No. 17/219,489, filed on Mar. 31, 2021, now Pat. No. 11,593,005.

(51) Int. Cl.
G06F 3/06 (2006.01)
G11C 16/26 (2006.01)

(52) U.S. Cl.
CPC ......... *G06F 3/0632* (2013.01); *G06F 3/0604* (2013.01); *G06F 3/064* (2013.01); *G06F 3/0679* (2013.01); *G11C 16/26* (2013.01)

(58) Field of Classification Search
CPC ...... G06F 3/0632; G06F 3/0604; G06F 3/064; G06F 3/0679; G11C 16/26; G11C 16/3495; G11C 5/147; G11C 16/16; G11C 16/30; G11C 16/34
See application file for complete search history.

(56) References Cited

U.S. PATENT DOCUMENTS

| 6,792,582 | B1 | 9/2004 | Cohn |
| 11,263,134 | B1 | 3/2022 | Sheperek |
| 11,340,813 | B1 | 5/2022 | Rayaprolu |
| 11,410,734 | B1* | 8/2022 | Muchherla ............. G11C 16/20 |
| 11,593,005 | B2* | 2/2023 | Muchherla ............. G06F 3/0604 |
| 2012/0250410 | A1 | 10/2012 | Kim |

(Continued)

*Primary Examiner* — Francisco A Grullon
(74) *Attorney, Agent, or Firm* — Lowenstein Sandler LLP

(57) ABSTRACT

A processing device of a memory sub-system is configured to sort a plurality of blocks of the memory device; identify, based on scanning of a first block at a first location of the plurality of sorted block, a first voltage bin associated with the first block; identify, based on scanning of a second block at a second location of the plurality of sorted blocks, a second voltage bin associated with the second block; and responsive to determining that the first voltage bin matches the second voltage bin, assign the first voltage bin to each block that is located between the first location of the plurality of sorted blocks and the second location of the plurality of sorted blocks.

20 Claims, 7 Drawing Sheets

(56) References Cited

U.S. PATENT DOCUMENTS

| | | | |
|---|---|---|---|
| 2014/0108828 A1* | 4/2014 | Breternitz | G06F 1/329 |
| | | | 713/300 |
| 2016/0005480 A1 | 1/2016 | Kim | |
| 2016/0148702 A1 | 5/2016 | Karakulak | |
| 2016/0313394 A1* | 10/2016 | Arsovski | G01R 31/2894 |
| 2017/0271031 A1 | 9/2017 | Sharon | |
| 2017/0276726 A1* | 9/2017 | Arsovski | G01R 31/2894 |
| 2020/0250030 A1 | 8/2020 | Sandell | |
| 2021/0166774 A1 | 6/2021 | Cha | |
| 2022/0050777 A1 | 2/2022 | Sheperek | |
| 2022/0084605 A1 | 3/2022 | Muchherla | |
| 2022/0164105 A1 | 5/2022 | Nowell | |
| 2022/0317902 A1* | 10/2022 | Muchherla | G06F 3/0604 |

* cited by examiner

MANAGING VOLTAGE BIN SELECTION FOR BLOCKS OF A MEMORY DEVICE

RELATED APPLICATIONS

This application is a continuation application of co-pending U.S. patent application Ser. No. 17/219,489, filed Mar. 31, 2021, which is incorporated herein by reference.

TECHNICAL FIELD

Embodiments of the disclosure are generally related to memory sub-systems, and more specifically, are related to managing voltage bin selection for blocks of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
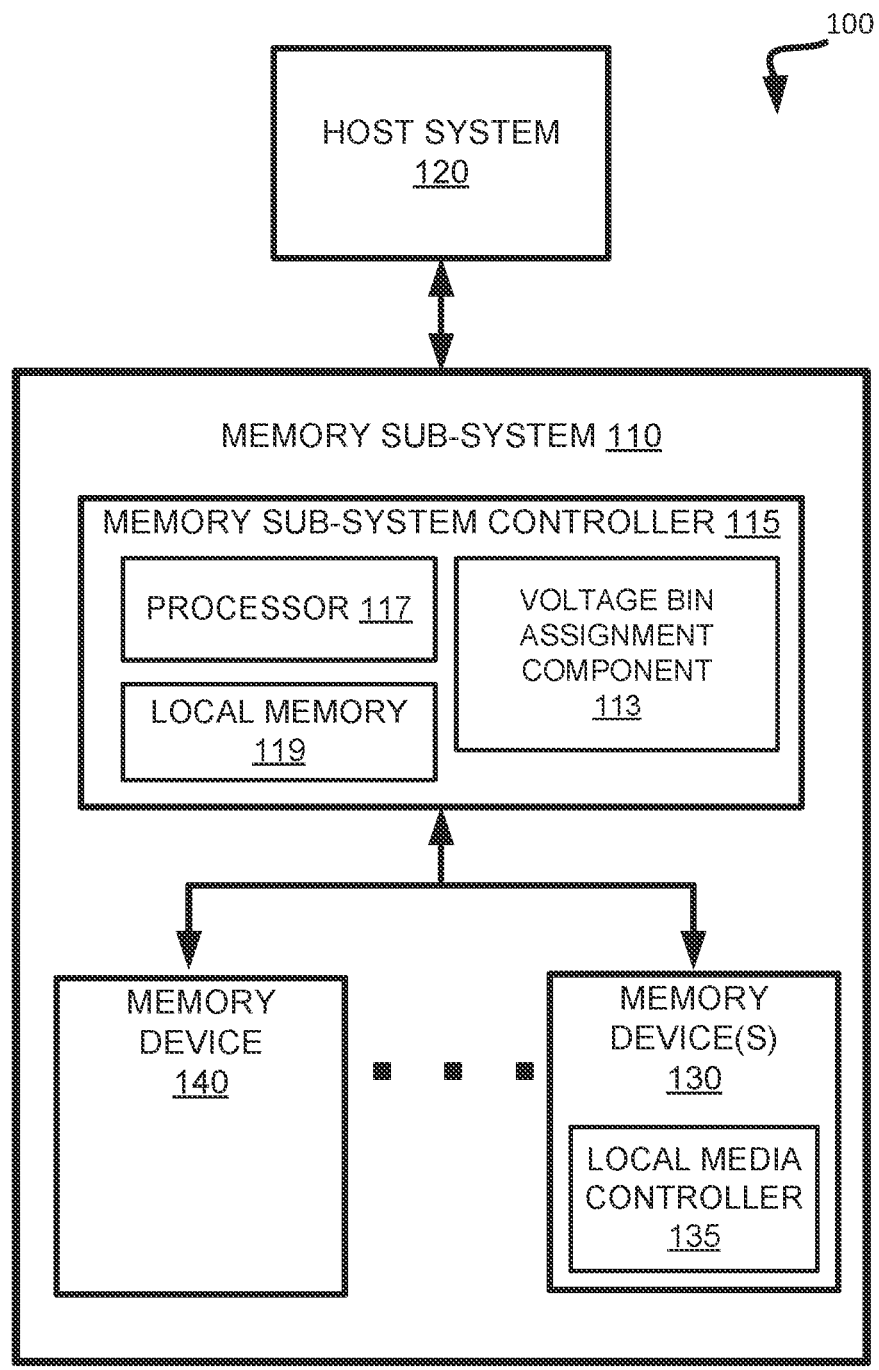
FIG. 1 illustrates an example computing system that includes a memory sub-system in accordance with some embodiments of the present disclosure.

Embodiments of the present disclosure are directed to managing voltage bin assignment to blocks of a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. A "block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows the establishment of multiple threshold voltage levels corresponding to different logical levels, thus effectively allowing a single memory cell to store multiple bits of information: a memory cell operated with $2n$ different threshold voltage levels is capable of storing n bits of information. Thus, the read operation can be performed by comparing the measured voltage exhibited by the memory cell to one or more reference read voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs a set of read threshold voltage bins (herein after voltage bins) and assigning each block stored at the memory devices of the memory sub-system voltage one of the voltage bins, based on a time after program of each block. A voltage bin represents a set of read level threshold voltages that can be used to perform read operation at a given block, such that each read level threshold voltage corresponds to a valley, where each valley is a distance between two adjacent data states of the block to be read. For example, for TLC blocks storing 3 bits, there can be 8 data states (i.e., levels) and 7 valleys. Hence each voltage bin for TLC blocks has 7 read voltages one for each valley. In some implementations, reads can be associated with pages and each page type corresponds to certain valleys. For the page reads, appropriate read voltages are read from the bin that is assigned to the block containing the page. The one or more valleys of each page type are determined by the Gray code used to represent the levels. Gray code refers to a binary numeral system were two successive valleys differ in only one bit (e.g., binary digit). On TLC blocks, some parts of the block can be multi-level cell (MLC) storing 2 bits per memory cell (resulting in 4 data states), or single level cell (SLC) storing 1 bit per memory cell. For MLC and SLC parts, there can be 3 and 1 read voltages respectively. The associations of blocks with dies and with voltage bins can be stored in respective metadata tables maintained by the memory sub-system controller.

While assigning voltage bins to blocks of the memory sub-system addresses the issue of temporal voltage shift, efficient methods of calculating the relative age of each block can be desired. For example, when the memory sub-system is powered off for extensive duration of time, the system is not able to track the power off time. When the memory sub-system is powered back on, it is desirable to identify a voltage bin for each block within a short amount of time by performing a small number of operations and a small number of blocks for scanning. Accordingly, a binary search and segmented binary search algorithms enable the assignment of voltage bins to blocks without having to scan each block.

In some embodiments, voltage bin selection techniques can use binary search and segmented binary search of blocks stored at memory devices of the memory sub-system, thus significantly improving the performance and accuracy of the voltage bin selection process for blocks of the memory sub-system. In accordance with embodiments of the present disclosure, blocks of a memory device can be sorted by the age of each block, from youngest block to oldest block. In one embodiment, the age of a block can refer to a time elapsed since the block was last programmed. The age of a block can be an absolute age of the block or a relative age the block (e.g., with respect to other blocks in a memory device). In one embodiment, one or more voltage bin selection techniques may be used to select a voltage bin for each block of the memory device, such that the voltage bin selection process is optimized for performance and accuracy.

In one embodiment, voltage bin selection for each block of a memory device can be performed by executing a binary search algorithm on a sorted list of the blocks of the memory device, in order to determine a small subset of the blocks to be scanned for voltage bin determination. In one implementation, scanning a block of the memory device can refer to performing read operations on the block using the read level voltage offsets associated with a given voltage bin and subsequently determining one or more reliability statistics based on the read operations of the block such that a voltage bin associated with a high reliability indicator can be selected and assigned to the block, as explained in more details below. In certain embodiment, when a voltage bin is selected for each of the scanned subset of blocks, each of the remaining blocks that were not scanned can have a voltage bin assigned based on the voltage bin selection for the scanned blocks. In certain embodiments, the subset of blocks to be scanned can include a first block at the top of a list of sorted blocks, a second block at the median of the sorted blocks, and a third block at the end of the list of sorted blocks.

After scanning the subset of blocks, the voltage bin assigned to the first block and the voltage bin assigned to the second block can be compared. Since the voltage bin assignment is proportional to the age of the blocks, if the first block and the second block are assigned to the same voltage bin then the set of blocks between the first block and the second block within the list of sorted blocks can also be assigned to the same voltage bin as the first block. Accordingly, if the voltage bin of the first block and the voltage bin of the second block match (e.g., are the same voltage bin), the blocks between the top of the sorted list and the median of the sorted list can be assigned to the same voltage bin as the first block and the second block. Given that the sorted list is sorted by the age of the blocks, the blocks between the first block and the second block in the sorted list can be assigned to the same voltage bin as the first block and/or the second block without having to scan those blocks. The blocks between the first block and the second block can then be assigned the voltage bin of the first block in the list. Similarly, the voltage bin assigned to the second block and the voltage bin assigned to the third block can be compared. If the voltage bin of the second block and the voltage bin of the third block match (e.g., are the same voltage bin), the blocks between the median of the sorted list and the bottom of the sorted list can be assigned the voltage bin of the second block in the list. In this case, the full list of blocks can be have an assigned voltage bin based on a scanning result of a few blocks of the list of blocks, thus improving the performance of scanning the memory device significantly.

On the other hand, if the voltage bin assigned to the first block and the voltage bin assigned to the second block do not match, the next iteration of binary search and scanning can be performed to the blocks of the sorted list that are between the first block and the second block, in order to identify the voltage bin to assign to each block between the first block and the second block. In this case, a fourth block at the median location between the first block and the second block can be identified, scanned, and a fourth voltage bin can be assigned to the fourth block based on the scanning result. If the voltage bin of the first block and the voltage bin of the fourth block match, the blocks between the first block and the fourth block within the sorted list can be assigned the voltage bin of the first block. Similarly, if the voltage bin assigned to the second block and the voltage bin assigned to the third block do not match, a new iteration of binary search and scanning can be performed to the blocks of the sorted list that are between the second block and the third block, in order to identify which voltage bin to assign to each block between the second block and the third block. In an embodiment, the process of comparing voltage bins of scanned blocks and performing new iterations of binary search and scanning of blocks can be repeated until a voltage bin is assigned to each block of the memory device.

In one embodiment, voltage bin selection for blocks of a memory device can be performed by executing a segmented binary search algorithm on a sorted list the blocks of the memory device, such that a limited subset of the blocks are scanned for voltage bin determination. In one implementation, blocks of the memory device can be sorted by the age of each block and the list of sorted blocks can be divided into a number of segments. In an embodiment, dividing the sorted blocks into segments (e.g., where each segment has an equal number of blocks) and then performing the binary search on each segment can improve the accuracy of voltage bin assignment. As an example, the impact of block to block variations is selecting a voltage bin can be limited to those blocks within the same segment because the binary search to assign voltage bins to blocks is performed on one segment as a time. A binary search algorithm can be performed separately on each segment to identify a subset of blocks of the segment to be scanned for voltage bin determination. The blocks of each segments can then be assigned to a voltage bin based on the scanning result of blocks of the respective segment, as explained in more details herein with respect to FIG. 4. In an illustrative example, for a given segment, a subset of three blocks can be selected for scanning including a first block at the top of a list of sorted blocks of the segment, a second block at a median of the sorted blocks of the segment, and a third block at the end of the list of sorted blocks of the segment. In an embodiment, the subset of blocks of the segment can be scanned and a voltage bin can be assigned to each block in the subset of blocks based on the scanning result, as explained in more details herein above.

The voltage bin assigned to the first block and the voltage bin assigned to the second block can then be compared to determine if the two voltage bins match. If the voltage bin of the first block and the voltage bin of the second block match, the blocks between the top of the sorted list and the median of the sorted list of the segment can be determined to have the same voltage bin as the first block and the second block because the voltage bin assignment is proportional with the age of the blocks. Accordingly, the blocks between the first block and the second block in the sorted list of the segment can be projected to have the same voltage bin assignment as the first block and/or the second block without having to scan those blocks. The blocks between the first block and the second block can then be assigned the voltage bin of the first block in the sorted list of the segment. Similarly, the voltage bin assigned to the second block and the voltage bin assigned to the third block of the subset of blocks of the segment can be compared. If the voltage bin of the second block and the voltage bin of the third block match, the blocks between the median of the sorted list of the segment and the bottom of the sorted list of the segment can be assigned the voltage bin of the second block in the list.

On the other hand, if the voltage bin assigned to the first block of the segment and the voltage bin assigned to the second block of the segment do not match, a second iteration of binary search and scanning can be performed to the blocks of the sorted list of the segment that are between the first block and the second block, in order to identify which voltage bin to assign to each block between the first block and the second block within the segment. In this case, a fourth block at a median location between the first block and the second block can be identified, scanned, and a fourth voltage bin can be assigned to the fourth block based on the scanning result. If the voltage bin of the first block and the voltage bin of the fourth block match, the blocks between the first block and the fourth block within the sorted list of the segment can be assigned the voltage bin of the first block. Similarly, if the voltage bin assigned to the second block and the voltage bin assigned to the third block do not match, a new iteration of binary search and scanning can be performed to the blocks of the sorted list of the segment that are between the second block and the third block, in order to identify which voltage bin to assign to each block between the second block and the third block. In an embodiment, the process of comparing voltage bins of scanned blocks of the segment and performing new iterations of binary search and scanning of blocks can be repeated until a voltage bin is assigned to each block of the segment. In an embodiment, the process of binary search and scanning for voltage bin selection can be performed for each segment of the group of segments comprising the blocks of the memory device, such that when voltage bin selection determination is complete for each segment of the group of segments, each block of the memory device is assigned a voltage bin. In one embodiment, blocks of the memory device can be divided equally into segments, such that each segment can have approximately the same number of blocks. In another embodiment, blocks of the memory device can be divided into segments based on the time after program of the blocks, as explained in more details herein below.

Therefore, advantages of the systems and methods implemented in accordance with some embodiments of the present disclosure include, but are not limited to, optimizing the voltage bin selection process, such that each block of the memory sub-system is assigned a voltage bin accurately while minimizing performance overhead on the memory sub-system. Because the voltage bin selection process supports performing a binary search to select only a subset of blocks to be scanned for voltage bin determination while projecting voltage bin assignment for the remaining blocks based on the scanning results, the performance of executing the voltage bin determination for blocks is optimized. Additionally, since the voltage bin selection process also supports performing a segmented binary search on the blocks, the impact of block to block variations is limited to only a specific range of bocks within the segment, thus improving the accuracy of the voltage bin selection for blocks of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD).

Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a voltage bin assignment component 113, which can be used to implement techniques for assigning voltage bins to blocks of a memory device 130-140 by performing binary search and segmented binary search, in accordance with embodiments of the present disclosure. In one implementation, voltage bin assignment component 113 can sort blocks of a memory device 130-140 by an age of each block, from youngest block to oldest block. In an implementation, the age of a block may refer to a time elapsed since the block was last programmed. In other implementations, the age of a block can refer to a relative age of the block that is based on a sequence in which the block is programmed (sequence number) or the power-on time stamp a block is programmed. Since a memory device is unable to track the power-off time, a cumulative power-on time can be cumulatively tracked by the memory sub-system and written to non-volatile memory before a power down, reloaded after power-up and power-on time is resumed from the previous value and updated on the non-volatile memory, thus enabling a monotonically increasing cumulative power-on time that can be used for time stamping when each block is programmed. Voltage bin assignment component 113 can perform voltage bin selection for each block of a memory device 130-140 by executing a binary search algorithm on a sorted list of the blocks of memory device 130-140 to determine a small subset of the blocks to be scanned for voltage bin determination.

In one implementation, scanning a block of the memory device can refer to performing read operations on the block using read level voltage offsets associated with a given voltage bin and subsequently determining one or more reliability statistics based on the read operations of the block. One example of a reliability statistic is raw bit error rate (RBER). The RBER corresponds to a number of bit errors per codeword that the data stored at the block experiences. A codeword may refer to the smallest read unit allowed. Voltage bin assignment component 113 can perform a second set of read operations using read level voltage offsets associated with a second voltage bin, and a corresponding second RBER is determined based on the second set of read operations. In this case, voltage bin assignment component 113 can select the voltage bin associated with the smallest RBER and can assign the selected bin to the block. In certain implementations, when a voltage bin is selected for each of the scanned subset of blocks, voltage bin assignment component 113 can assign a voltage bin to each of the remaining blocks that were not scanned based on the voltage bin selection for the scanned blocks. Voltage bin assignment component 113 can select a first block at the top of a list of sorted blocks, a second block at a median of the sorted blocks, and a third block at the end of the list of sorted blocks to include in the subset of blocks to be scanned for voltage bin determination.

When the subset of blocks is scanned, voltage bin assignment component 113 can compare the voltage bin assigned to the first block and the voltage bin assigned to the second block to determine if the two voltage bins refer to the same bin value. If the voltage bin of the first block and the voltage bin of the second block match (e.g., are the same voltage bin), voltage bin assignment component 113 can determine that the blocks between the top of the sorted list and the median of the sorted list have the same characteristics and can be assigned the same voltage bin as the first block and the second block. Accordingly, given that the sorted list of blocks is sorted by the age of the blocks, the blocks between the first block and the second block in the sorted list can be projected to have the same voltage bin assignment as the first block and/or the second block without having to scan those blocks. Voltage bin assignment component 113 then assigns the voltage bin of the first block in the list to the blocks between the first block and the second block. In one implementation, voltage bin assignment component 113 can also compare the voltage bin assigned to the second block and the voltage bin assigned to the third block and if the voltage bin of the second block and the voltage bin of the third block match (e.g., are the same voltage bin), voltage bin assignment component 113 can assign the voltage bin of the second block in the sorted list to the blocks between the median of the sorted list and the bottom of the sorted list can be assigned.

If the voltage bin assigned to the first block and the voltage bin assigned to the second block do not match, voltage bin assignment component 113 can initiate a second iteration of binary search and scanning, in order to identify which voltage bin to assign to each block between the first block and the second block. In this case, voltage bin assignment component 113 can identify a fourth block at a median location between the first block and the second block. Voltage bin assignment component 113 can scan the fourth block and can assign a fourth voltage bin to the fourth block based on the scanning result. Voltage bin assignment component 113 can compare the voltage bin of the first block and the voltage bin of the fourth block. If the voltage bins match, voltage bin assignment component 113 can assign the voltage bin of the first block to the blocks between the first block and the fourth block within the sorted list. In an implementation, voltage bin assignment component 113 can repeat the process of comparing voltage bins of scanned blocks and performing new iterations of binary search and scanning of blocks until a voltage bin is assigned to each block of memory device 130-140.

In some implementations, voltage bin assignment component 113 can execute a segmented binary search algorithm on the sorted list the blocks of memory device 130-140 in order to perform voltage bin selection for blocks of memory device 130-140. In one implementation, voltage bin assignment component 113 can sort blocks of the memory device by an age of each block and can divide the list of sorted blocks into a number of segments. Voltage bin assignment component 113 can then perform a binary search algorithm on each segment to determine a subset of blocks of the segment to be scanned for voltage bin determination. Voltage bin assignment component 113 can assigned a voltage bin to the blocks of each segments based on the scanning result of blocks of the respective segment. In an illustrative example, for a given segment, voltage bin assignment component 113 can select a subset of three blocks for scanning including a first block at the top of a list of sorted blocks of the segment, a second block at a median of the sorted blocks of the segment, and a third block at the end of the list of sorted blocks of the segment. In an implementation, voltage bin assignment component 113 can scan the subset of blocks of the segment and assign a voltage bin to each block in the subset of blocks based on the scanning result of the subset of blocks, as explained in more details herein above. In an implementation, voltage bin assignment component 113 can repeat the process of binary search and scanning for voltage bin selection for each segment of the group of segments comprising the blocks of memory device 130-140, such that when voltage bin selection determination is complete for each segment of the group of segments, each block of memory device 130-140 is assigned a voltage bin.

In one implementation, voltage bin assignment component 113 can divide the blocks of memory device 130-140 into segments equally, such that each segment can have approximately the same number of blocks. In another implementation, voltage bin assignment component 113 can divide the blocks of memory device 130-140 into segments based on a time after program of the block. As an example, if a first set of blocks of the memory device have a time after program that is significantly higher than the time after program of a second set of blocks (e.g., the first set has been programmed three months ago), voltage bin assignment component 113 can assign the first set of blocks to a separate segment. Voltage bin assignment component 113 can subsequently assign the second set of blocks to additional segments either based on the time after program of the blocks or based on satisfying a threshold number of blocks per segment.

Figure 2:
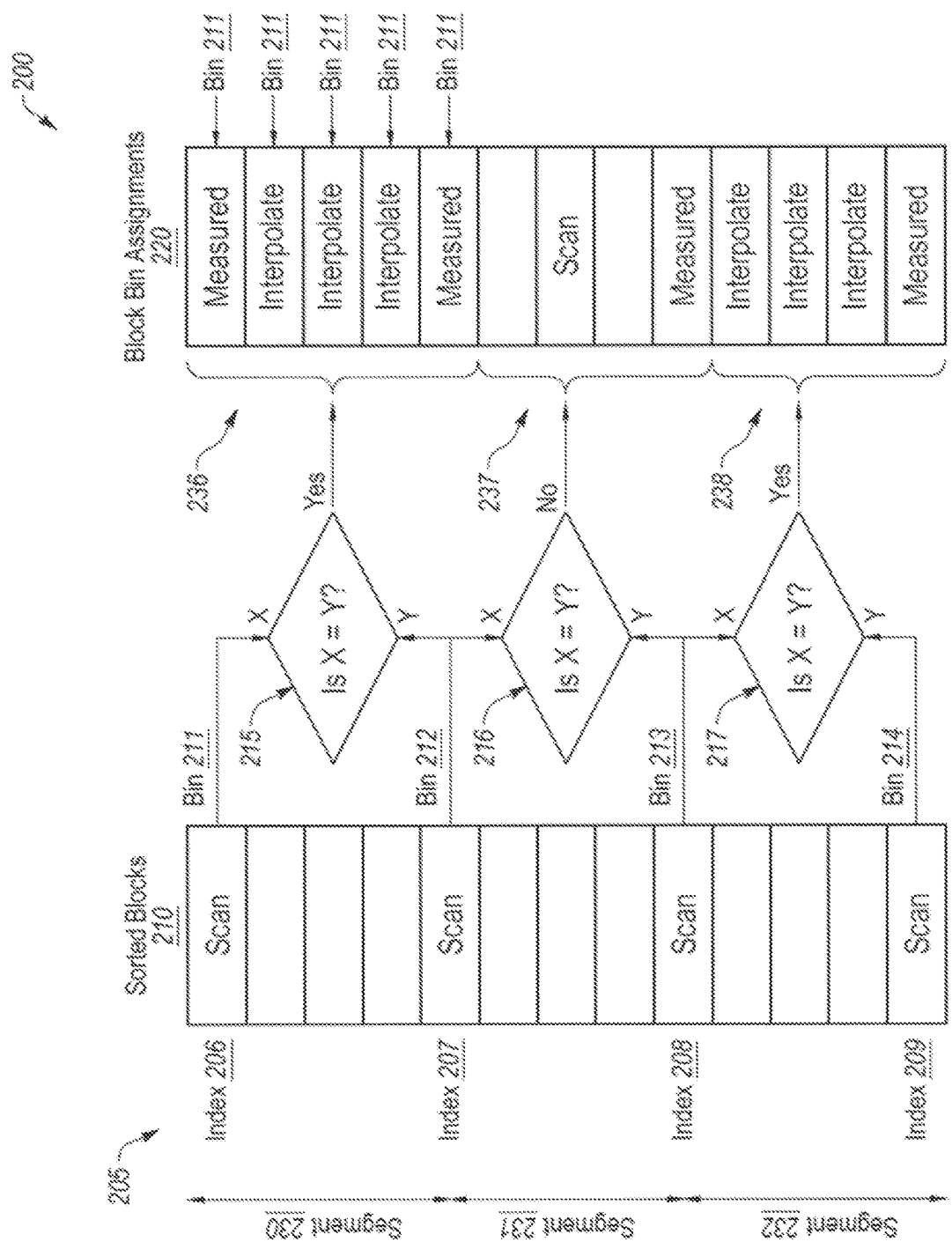
FIG. 2 depicts a block diagram illustrating an example method of assigning voltage bins to blocks of a memory device using a segmented binary search technique, in accordance with one or more aspects of the present disclosure.

FIG. 2 depicts a block diagram illustrating an example method 200 of assigning voltage bins to blocks of a memory device using a segmented binary search technique, in accordance with one or more aspects of the present disclosure. Method 200 may be performed by processing logic that includes hardware (e.g., circuitry, dedicated logic, programmable logic, microcode, etc.), software (e.g., instructions run on a processor to perform hardware simulation), or a combination thereof. In some embodiments, the method 200 is performed by voltage bin assignment component 113 of FIG. 1.

Method 200 starts at operation 205. At operation 205, the processing logic sorts blocks of a memory device by an age of each block, to generate sorted blocks 210. In an implementation, the age of a block may refer to a time elapsed since the block was last programmed. As an example, an age of a block may be represented by a block version field that is assigned a value that is unique for each block of the memory device. Sorted blocks 210 can then be divided into segments 230-232, such that segment 230 can include blocks between index 206 to index 207 of sorted blocks 210, segment 231 can include blocks between index 207 to index 208 of sorted blocks 210, and segment 232 can include blocks between index 208 to index 209 of sorted blocks 210. Indexes 206-209 can have any number of blocks between them and may not be interpreted to indicate adjacent indexes of the corresponding segment. In this case, a block at index 207 may be assigned to segment 230 as the last block in the segment and also assigned to segment 231 as the first block in the segment. In another implementation, a block at index 207 can be assigned to segment 230 as the last block in the segment and a second block at index 207+1 can be assigned to segment 231 as the first block in the segment.

At operation 215, the processing logic scans the block at index 206 to determine a voltage bin to be assigned to block at index 206. In an implementation, a block can be scanned by performing multiple read operations using read level voltages associated with multiple voltage bins and selecting a voltage bin of the multiple voltage bins that results in a minimum RBER based on the read operations, as explained in more details herein. After scanning block at index 206 of segment 230, voltage bin 211 can be determined based on the scanning results and can be assigned to block at index 206. Similarly, the processing logic scans the block at index 207 of segment 230 to determine a voltage bin to be assigned to block at index 207. voltage bin 212 can be determined based on a scanning results of block at index 207 and voltage bin 212 can be assigned to block at index 207. Voltage bin 211 and voltage bin 212 can then be compared to determine if voltage bin 211 ($x$) and voltage bin 212 ($y$) refer to the same voltage bin.

At operation 236, the processing logic determines that voltage bin 211 matches voltage bin 212, and further determines that the blocks between index 206 and index 207 of segment 230 can be projected to have the same voltage bin assignment as the block at index 206, without having to scan other blocks within segment 230. The processing logic then assigns bin 211 to each block between index 206 and index 207 of block bin assignment list 220. The processing logic can then proceed to process segment 231.

At operation 216, the processing logic scans the block at index 208 to determine a voltage bin to be assigned to block at index 208. Based on scanning results of block at index 208 of segment 231, voltage bin 213 can be determined and can be assigned to block at index 208. Given that block at index 207 already has voltage bin 212 assigned at operation 215, processing logic can proceed to compare voltage bin 212 and voltage bin 213, in order to determine how to perform voltage bin assignments to blocks of segment 231.

At operation 237, the processing logic determines that voltage bin 212 does not match voltage bin 213, and further determines that the blocks between index 207 and index 208 of segment 231 may not be projected to have the same voltage bin assignment as the block at index 207. Processing logic then determines that each block between index 207 and index 208 of segment 231 can be scanned and a voltage bin determination can be performed based on the scanning result of each block between index 207 and index 208. Processing logic then performs scanning operations of blocks between index 207 and index 208 and assign a corresponding voltage bin to each block based on the scanning results of each block, as explained in more details herein.

At operation 217, the processing logic processes segment 232 by scanning the block at index 209 to determine a voltage bin to be assigned to block at index 209. Based on scanning results of block at index 209 of segment 232, voltage bin 214 can be determined and can be assigned to block at index 209. Given that block at index 208 already has voltage bin 213 assigned at operation 216, processing logic can proceed to compare voltage bin 213 and voltage bin 214, in order to determine how to perform voltage bin assignments to blocks of segment 232.

At operation 238, the processing logic determines that voltage bin 213 matches voltage bin 214, and further determines that the blocks between index 208 and index 209 of segment 232 can be projected to have the same voltage bin assignment as the block at index 208, without having to scan other blocks within segment 232, because blocks of segment 232 are sorted by an age of the blocks. The processing logic then assigns bin 213 to each block between index 208 and index 209 of block bin assignment list 220. In certain implementations, the processing logic may repeat the operations of method 200 based on a predetermined schedule in order to adjust and/or update bin determinations of blocks of the memory device as the age of each block changes over time.

Figure 3:
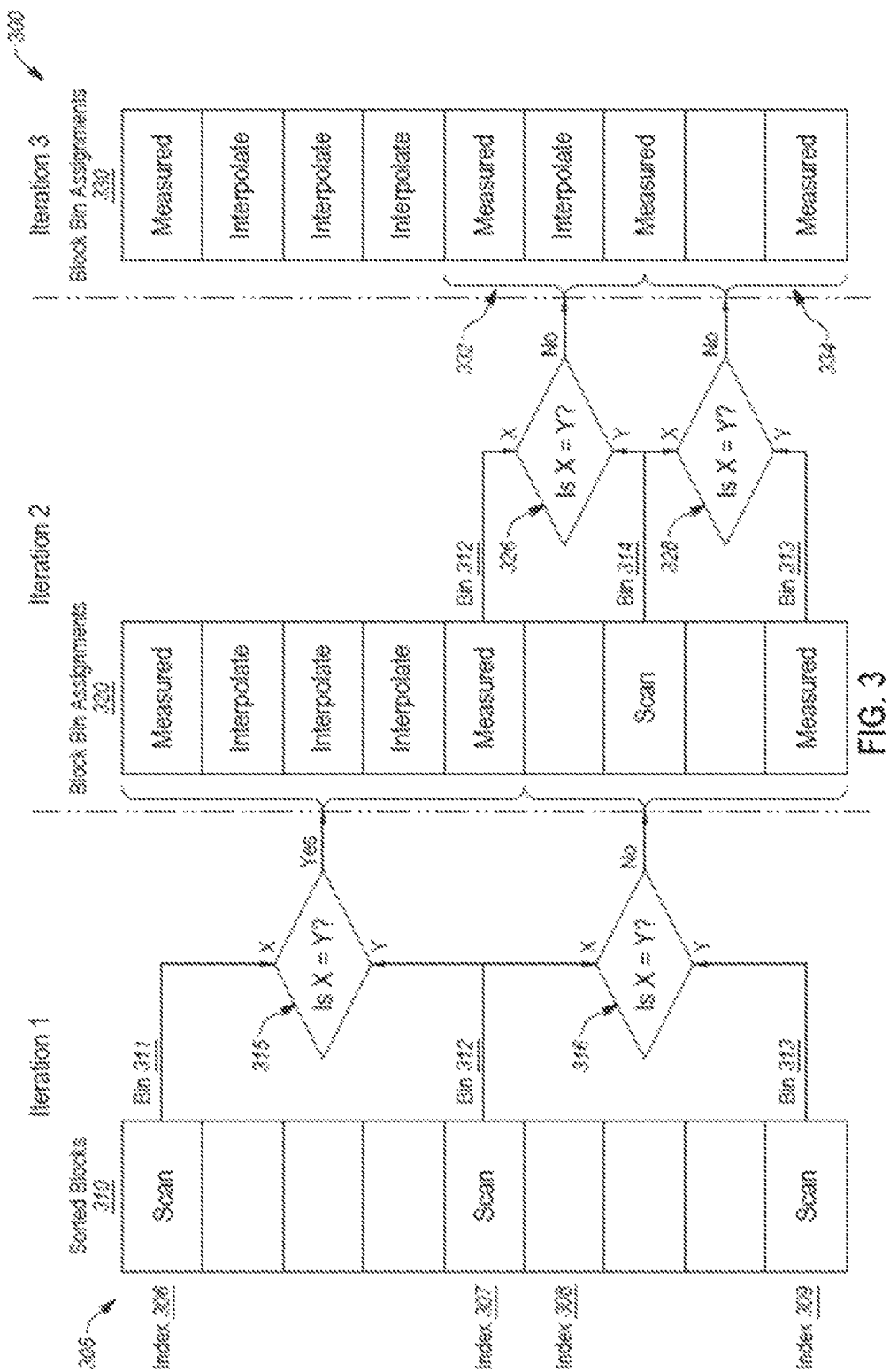
FIG. 3 depicts a block diagram illustrating an example method of assigning voltage bins to blocks of a memory device using a binary search technique, in accordance with one or more aspects of the present disclosure.

FIG. 3 depicts a block diagram illustrating an example method 300 of assigning voltage bins to blocks of a memory device using a binary search technique, in accordance with one or more aspects of the present disclosure. Method 300 may be performed by processing logic that includes hardware (e.g., circuitry, dedicated logic, programmable logic, microcode, etc.), software (e.g., instructions run on a processor to perform hardware simulation), or a combination thereof. In some embodiments, the method 300 is performed by voltage bin assignment component 113 of FIG. 1.

Method 300 starts at operation 305. At operation 305, the processing logic sorts blocks of a memory device by an age of each block, to generate sorted blocks 310. In an implementation, the age of a block may refer to a time elapsed since the block was last programmed and may be represented by a block version field that is assigned a unique value for each block of the memory device. In an illustrative example a block having a version number of 5000 was programmed before another block that has a version number of 5001 and so on. The processing logic can Sorted blocks 310 can be perform iteration 1 to scan the block at the top of sorted list 310 (i.e., block at index 306), the block the median of sorted list 310 (i.e., block at index 307), and the block at the bottom of sorted list 310 (i.e., block at index 309). In an implementation, the processing logic scans blocks at indexes 306, 307, and 309 to assignment voltage bins to blocks at indexes 306, 307, and 309 and to determine how to assign voltage bins to the remaining blocks of sorted list 310.

At operation 315, the processing logic scans the block at index 306 to determine a voltage bin to be assigned to block at index 306. In an implementation, a block can be scanned by performing multiple read operations using read level voltages associated with multiple voltage bins and selecting a voltage bin of the multiple voltage bins that results in a minimum RBER based on the read operations, as explained in more details herein. After scanning block at index 306, voltage bin 311 can be determined based on the scanning results and can be assigned to block at index 306. Similarly, the processing logic scans the block at index 307 to determine a voltage bin to be assigned to block at index 307. Voltage bin 312 can be determined based on a scanning results of block at index 307 and voltage bin 312 can be assigned to block at index 307. Voltage bin 311 and voltage bin 312 can then be compared to determine if voltage bin 311 ($x$) and voltage bin 312 ($y$) refer to the same voltage bin.

At operation 322, the processing logic determines that voltage bin 311 matches voltage bin 312, and further determines that the blocks between index 306 and index 307 can be projected to have the same voltage bin assignment as the block at index 306, without having to scan each block between index 306 and index 307. The processing logic then assigns bin 311 to each block between index 306 and index 307 of block bin assignment list 320. The processing logic can then proceed to scan the block at index 309.

At operation 316, the processing logic scans the block at index 309 to determine a voltage bin to be assigned to block at index 309. Based on scanning results of block at index 309, voltage bin 313 can be determined and can be assigned to block at index 309. Given that block at index 307 already has voltage bin 312 assigned at operation 315, processing logic can proceed to compare voltage bin 312 and voltage bin 313, in order to determine how to perform voltage bin assignments to the blocks of between index 307 and index 309.

At operation 324, the processing logic determines that voltage bin 312 does not match voltage bin 313, and further determines that the blocks between index 307 and index 308 may not be projected to have the same voltage bin assignment as the block at index 307. Processing logic then proceed to iteration 2 to perform a new binary search on blocks between the block at index 307 and the block at index 309. In order to perform the binary search, the processing logic determines a block at index 308 representing a median location between the block at index 307 and the block at index 309 and performs a scanning operation of the block at index 308. Based on the scanning result of the block at index 309, the processing logic determines that voltage bin 314 is appropriate for the block at index 309 and assigned voltage bin 314 to the block at index 209.

At operation 326, the processing logic compares voltage bin 312 and voltage bin 314 to determine if voltage bin 312 ($x$) and voltage bin 314 ($y$) refer to the same voltage bin. The processing logic then determines that voltage bin 312 matches voltage bin 314, and further determines that the blocks between index 307 and index 308 can be projected to have the same voltage bin assignment as the block at index 307, without having to scan each block between index 307 and index 308. At operation 332, the processing logic assigns bin 312 to each block between index 307 and index 308 of block bin assignment list 320.

At operation 328, the processing logic compares voltage bin 314 and voltage bin 313, in order to determine how to perform voltage bin assignments to the blocks of between index 308 and index 309 of sorted blocks list 310. At operation 334, the processing logic determines that voltage bin 314 does not match voltage bin 313, and further determines that the blocks between index 308 and index 309 may not be projected to have the same voltage bin assignment as the block at index 308. Processing logic then proceed to iteration 3 to perform a new binary search on blocks between the block at index 308 and the block at index 309, as explained in more details above at operation 324.

Figure 4:
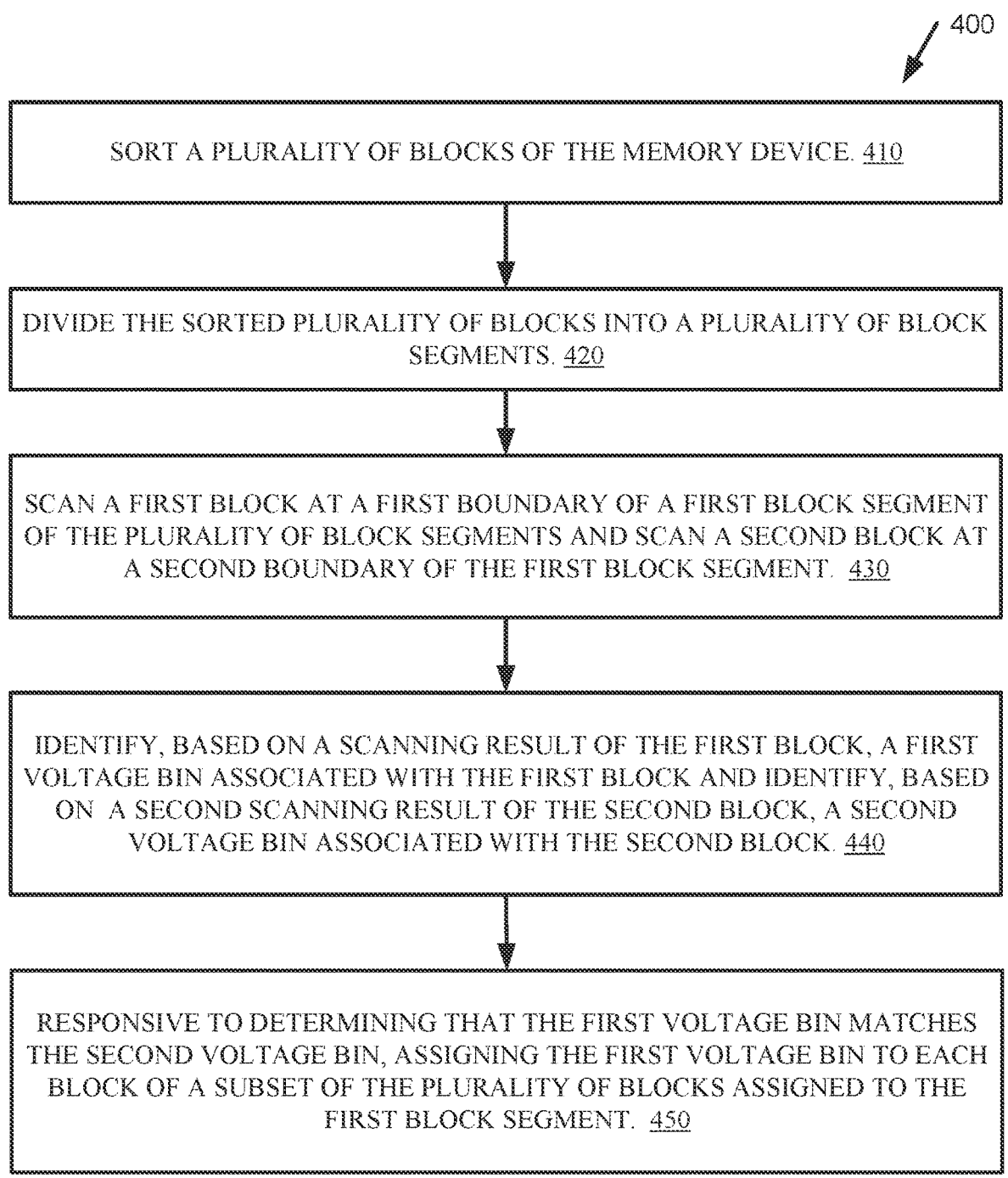
FIG. 4 is a flow diagram of an example method of assigning voltage bins to blocks of a memory device using segmented binary search, in accordance with some embodiments of the present disclosure.

FIG. 4 is a flow diagram of an example method of assigning voltage bins to blocks of a memory device using segmented binary search, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the voltage bin assignment component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 410, the processing logic sorts a set of blocks of a memory device based on an age of each block of the memory device. In an implementation, the age of a block can be represented by a block version field of the block that is updated each time the block is programmed, as explained in more details above.

At operation 420, the processing logic divides the sorted set of blocks into block segments. In an implementation, blocks of the memory device can be divided equally into the block segments. In another embodiment, block of the memory device can be divided into block segments based on the age of the blocks, as explained in more details herein.

At operation 430, the processing logic scans a first block at a first boundary of a first block segment of the block segments and scans a second block at a second boundary of the first block segment. In one implementation, a block at the first boundary can be a block having the youngest age among blocks of the block segment and a block at the second boundary can be a block having the oldest age among blocks of the block segment.

At operation 440, the processing logic identifies, based on a scanning result of the first block, a first voltage bin associated with the first block and identifies, based on a second scanning result of the second block, a second voltage bin associated with the second block. In an implementation, the first voltage bin and the second voltage bin include read level voltages that can be used to perform read operations of data stored in the corresponding block, as explained in more details herein above.

At operation 450, the processing logic determines whether the first voltage bin of the first block matches the second voltage bin of the second block. When the processing logic determines that the first voltage bin matches the second voltage bin (e.g., the first voltage bin an the second voltage bin reference the same bin), the processing logic determines that the remaining blocks of the block segment that were not scanned can be projected to have the same bin either boundary of the segment. The processing logic then proceeds to assign the first voltage bin to each block within the first block segment.

Figure 5:
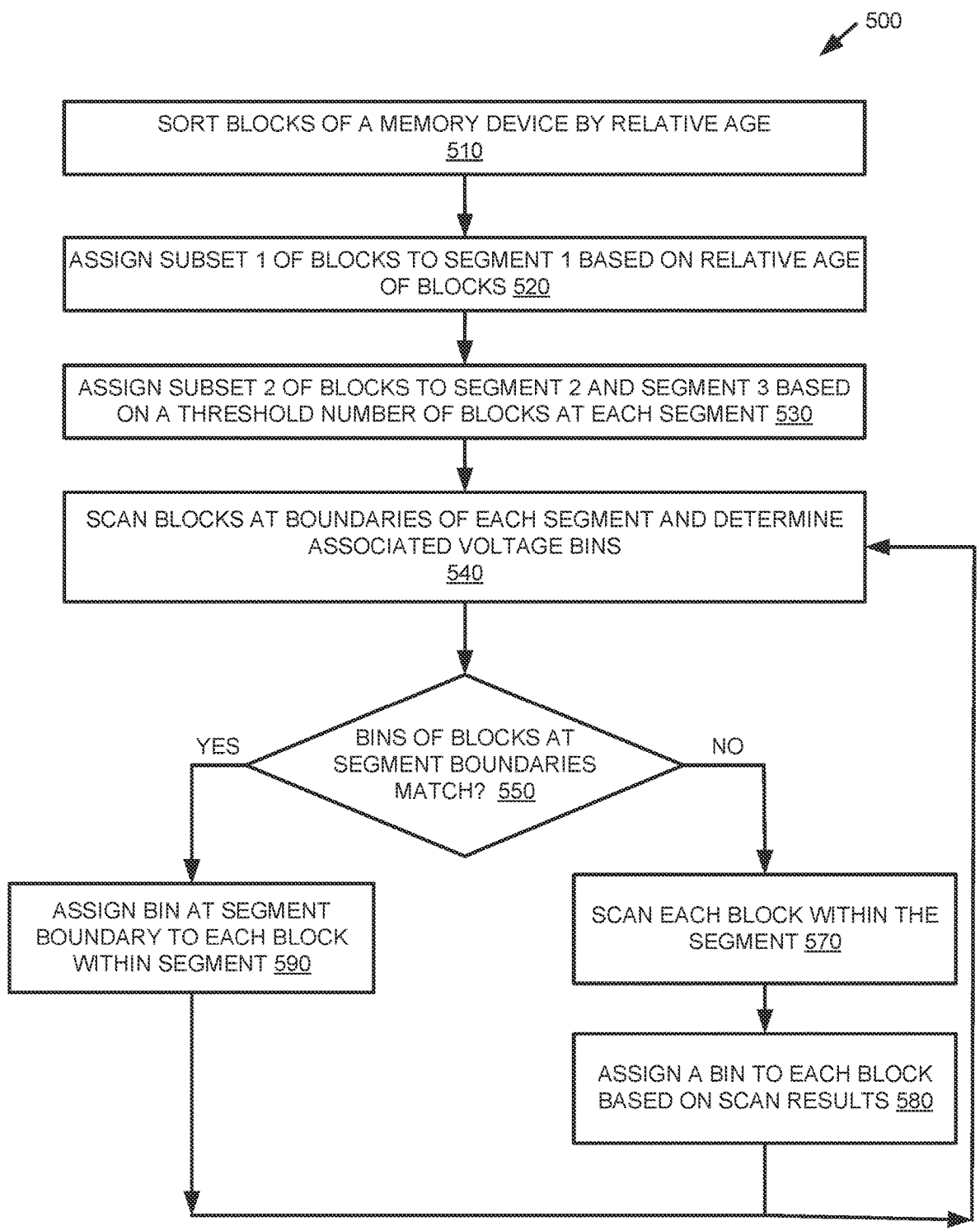
FIG. 5 is a flow diagram of an example method of assigning voltage bins to blocks of a memory device by dividing blocks into segments based on a time after program of the blocks, in accordance with some embodiments of the present disclosure.

FIG. 5 is a flow diagram of an example method of assigning voltage bins to blocks of a memory device by dividing blocks into segments based on a time after program of the blocks, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the voltage bin assignment component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 510, the processing logic sorts a set of blocks of a memory device based on an age of each block of the memory device. At operation 520, the processing logic assigns subset 1 of the sorted blocks to segment 1 based on a time after program value of each block. In an implementation, the processing logic can determine that subset 1 of the blocks represents a high percentage of the blocks of the memory device (e.g., 60%) that has a time after program of three month or more. The processing logic can further determine that the remaining blocks of the memory device, represented by subset 2, have a time after program of several hours (e.g., blocks have been programmed within the last 10 hours). The processing logic can then determine to assign subset 1 of the sorted blocks in a separate segment than subset 2 of the sorted blocks.

Accordingly, at operation 520, the processing logic assigns subset 1 of the sorted bocks to segment 1, based on a relative age each block of the subset 1 blocks and at operation 530, the processing logic assigns subset 2 of the sorted bocks to one or more segments. Since the blocks in subset 2 have a significantly younger age than the blocks in subset 1, the processing logic can splits the blocks of subset 2 equally between segment 2 and segment 3.

At operation 540, the processing logic scans the blocks at the boundaries of each of segment 1, 2, and 3 and determine an associated voltage bin for each scanned block, as explained in more details herein above. At operation 550, the processing logic starts a loop to determine if the voltage bins assigned to blocks at the boundaries of each segment match each other. If the voltage bins assigned to the blocks at the boundaries of segment 1 match, the processing logic proceeds to operation 590. At operation 590, the processing logic assigns the voltage bin of a block at a first boundary of segment 1 to each block within segment 1. The processing logic can then continue to operation 540 to process the next segment.

On the other hand, if the processing logic determines that the voltage bins assigned to blocks at the boundaries of segment 1 do not match, the processing logic can proceed to operation 570. At operation 570, the process logic scans each block within segment to determine a corresponding voltage bin for each block. In other implementations, the processing logic can perform a new binary search on a subset of blocks of segment 1 and determines a corresponding voltage bin based on the binary search. At operation 580, the processing logic assigns the determined voltage bin based on the scanning result to blocks of segment 1, as explained in more details herein above. The processing logic can then continue to operation 540 to process the next segment.

Figure 6:
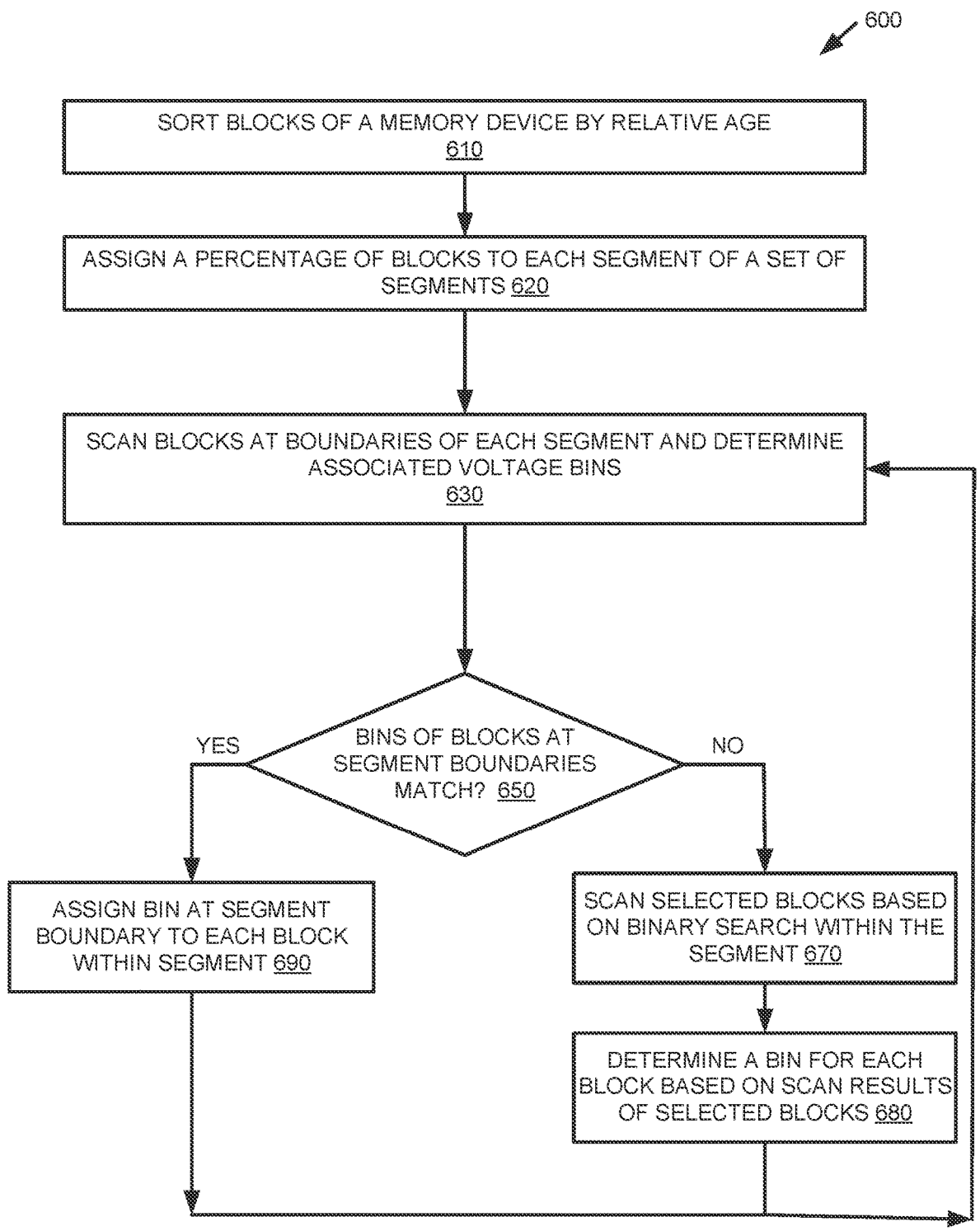
FIG. 6 is a flow diagram of an example method of assigning voltage bins to blocks of a memory device by dividing blocks into segments based on a number of blocks at each segment, in accordance with some embodiments of the present disclosure.

FIG. 6 is a flow diagram of an example method of assigning voltage bins to blocks of a memory device by dividing blocks into segments based on a number of blocks at each segment, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the voltage bin assignment component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 610, the processing logic sorts a set of blocks of a memory device based on an age of each block of the memory device. At operation 620, the processing logic assigns a percentage of the total number of sorted blocks to each segment of a set of segment, such that each subset can have approximately the same number of blocks. As an example, the processing logic can assign 25% of the blocks into each segment of a set of four segments. The processing logic can then determine a block at each boundary of each segment for scanning and voltage bin determination, as explained in more details herein above.

At operation 630, the processing logic scans the blocks at the boundaries of each of segment of the set of segments and determine an associated voltage bin for each scanned block, as explained in more details herein above. At operation 650, the processing logic starts a loop to determine if the voltage bins assigned to blocks at the boundaries of each segment match each other. If the voltage bins assigned to the blocks at the boundaries of a given segment match, the processing logic proceeds to operation 690. At operation 690, the processing logic assigns the voltage bin of a block at a first boundary of the segment to each block within the segment. The processing logic can then continue to operation 630 to process the next segment.

On the other hand, if the processing logic determines that the voltage bins assigned to blocks at the boundaries of the given segment do not match, the processing logic can proceed to operation 670. At operation 670, the process logic performs a binary search to select a subset of blocks to be scanned, as explained in more details herein. The processing logic further scans the selected subset of blocks of the given segment. At operation 680, the processing logic determines a voltage bin for each block within the segment based on the scanning result of the subset of selected blocks, as explained in more details herein with respect to FIG. 2. The processing logic can then continue to operation 630 to process the next segment.

Figure 7:
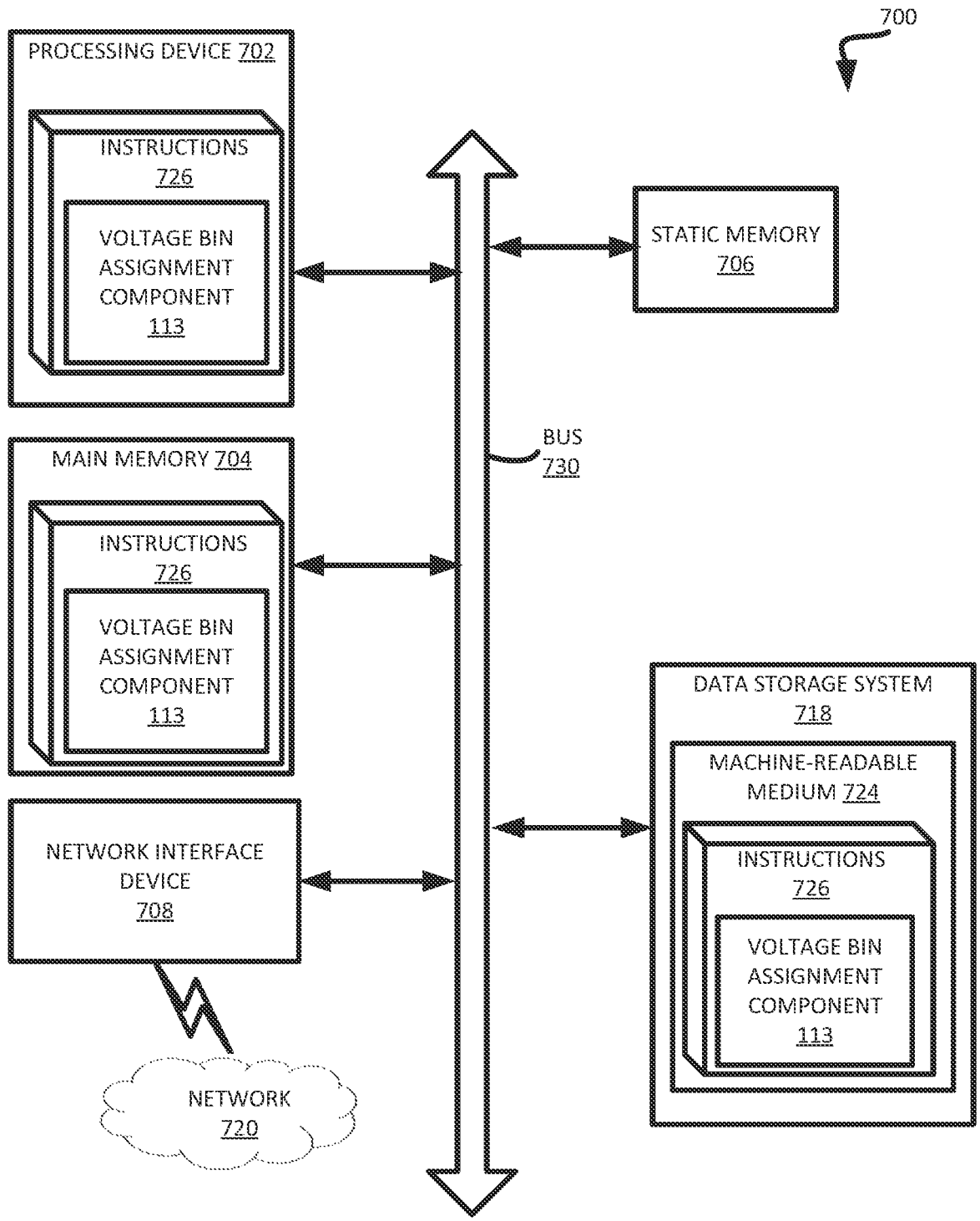
FIG. 7 illustrates an example machine of a computer system within which a set of instructions, for causing the machine to perform any one or more of the methodologies discussed herein, can be executed.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to voltage bin assignment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to voltage bin assignment component 113 of FIG. 1. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
sorting a plurality of blocks of the memory device;
identifying, based on scanning of a first block at a first location of the plurality of sorted block, a first voltage bin associated with the first block;
identifying, based on scanning of a second block at a second location of the plurality of sorted blocks, a second voltage bin associated with the second block; and
responsive to determining that the first voltage bin matches the second voltage bin, assigning the first voltage bin to each block that is located between the first location of the plurality of sorted blocks and the second location of the plurality of sorted blocks.

2. The system of claim 1, wherein sorting the plurality of blocks is performed based on an age of each block of the plurality of blocks.

3. The system of claim 1, wherein the processing device is to perform further operations comprising:
dividing the sorted plurality of blocks into a plurality of block segments, wherein each block segment of the plurality of block segments comprises a corresponding subset of blocks of the plurality of blocks of the memory device and is determined based on an age of each block of the corresponding subset of blocks.

4. The system of claim 3, wherein the first location corresponds to a first boundary of a first block segment of the plurality of block segments, and the second location corresponds to a second boundary of the first block segment, and wherein the first voltage block is assigned to each block of the first block segment.

5. The system of claim 4, wherein the processing device is to perform further operations comprising:

responsive to determining that the first voltage bin does not match the second voltage bin:
  scanning each block of a subset of the plurality of blocks assigned to the first block segment; and
  identifying a corresponding bin associated with a respective block based on a corresponding scanning result of the respective block.

6. The system of claim 4, wherein the processing device is to perform further operations comprising:
responsive to determining that the first voltage bin does not match the second voltage bin:
  scanning a third block at a predetermined location within the first block segment;
  identifying, based on scanning of the third block, a third voltage bin associated with the third block; and
  responsive to determining that the first voltage bin matches the third voltage bin, assigning the first voltage bin to each block of a second subset of the sorted plurality of blocks, wherein the second subset of blocks is located between the first boundary of the first block segments and a predetermined location within the first block segment.

7. The system of claim 4, wherein the processing device is to perform further operations comprising:
for each block segment of the plurality of block segments:
  identifying, based on scanning of a third block at a corresponding first boundary of a respective block segment of the plurality of block segments, a third voltage bin associated with the third block;
  identifying, based on scanning of a fourth block at a corresponding second boundary of the respective block segment of the plurality of block segments, a fourth voltage bin associated with the fourth block; and
  responsive to determining that the third voltage bin matches the fourth voltage bin, assigning the third voltage bin to each block of the respective block segment.

8. A method comprising:
sorting, by a processing device, a plurality of blocks of the memory device;
identifying, based on scanning of a first block at a first location of the plurality of sorted block, a first voltage bin associated with the first block;
identifying, based on scanning of a second block at a second location of the plurality of sorted blocks, a second voltage bin associated with the second block; and
responsive to determining that the first voltage bin matches the second voltage bin, assigning the first voltage bin to each block that is located between the first location of the plurality of sorted blocks and the second location of the plurality of sorted blocks.

9. The method of claim 8, wherein sorting the plurality of blocks is performed based on an age of each block of the plurality of blocks.

10. The method of claim 8, further comprising:
dividing the sorted plurality of blocks into a plurality of block segments, wherein each block segment of the plurality of block segments comprises a corresponding subset of blocks of the plurality of blocks of the memory device and is determined based on an age of each block of the corresponding subset of blocks.

11. The method of claim 10, wherein the first location corresponds to a first boundary of a first block segment of the plurality of block segments, and the second location corresponds to a second boundary of the first block segment, and wherein the first voltage block is assigned to each block of the first block segment.

12. The method of claim 10, further comprising:
responsive to determining that the first voltage bin does not match the second voltage bin:
  scanning each block of a subset of the plurality of blocks assigned to the first block segment; and
  identifying a corresponding bin associated with a respective block based on a corresponding scanning result of the respective block.

13. The method of claim 10, further comprising:
responsive to determining that the first voltage bin does not match the second voltage bin:
  scanning a third block at a predetermined location within the first block segment;
  identifying, based on scanning of the third block, a third voltage bin associated with the third block; and
  responsive to determining that the first voltage bin matches the third voltage bin, assigning the first voltage bin to each block of a second subset of the sorted plurality of blocks, wherein the second subset of blocks is located between the first boundary of the first block segments and a predetermined location within the first block segment.

14. The method of claim 10, further comprising:
for each block segment of the plurality of block segments:
  identifying, based on scanning of a third block at a corresponding first boundary of a respective block segment of the plurality of block segments, a third voltage bin associated with the third block;
  identifying, based on scanning of a fourth block at a corresponding second boundary of the respective block segment of the plurality of block segments, a fourth voltage bin associated with the fourth block; and
  responsive to determining that the third voltage bin matches the fourth voltage bin, assigning the third voltage bin to each block of the respective block segment.

15. A non-transitory computer-readable storage medium comprising instructions that, when executed by a processing device, cause the processing device to perform operations comprising:
sorting a plurality of blocks of the memory device;
identifying, based on scanning of a first block at a first location of the plurality of sorted block, a first voltage bin associated with the first block;
identifying, based on scanning of a second block at a second location of the plurality of sorted blocks, a second voltage bin associated with the second block; and
responsive to determining that the first voltage bin matches the second voltage bin, assigning the first voltage bin to each block that is located between the first location of the plurality of sorted blocks and the second location of the plurality of sorted blocks.

16. The non-transitory computer-readable storage medium of claim 15, wherein sorting the plurality of blocks is performed based on an age of each block of the plurality of blocks.

17. The non-transitory computer-readable storage medium of claim 15, wherein the processing device is to perform further operations comprising:
dividing the sorted plurality of blocks into a plurality of block segments, wherein each block segment of the plurality of block segments comprises a corresponding subset of blocks of the plurality of blocks of the memory device and is determined based on an age of each block of the corresponding subset of blocks.

18. The non-transitory computer-readable storage medium of claim 17, wherein the first location corresponds to a first boundary of a first block segment of the plurality of block segments, and the second location corresponds to a second boundary of the first block segment, and wherein the first voltage block is assigned to each block of the first block segment.

19. The non-transitory computer-readable storage medium of claim 17, wherein the processing device is to perform further operations comprising:
  responsive to determining that the first voltage bin does not match the second voltage bin:
    scanning each block of a subset of the plurality of blocks assigned to the first block segment; and
    identifying a corresponding bin associated with a respective block based on a corresponding scanning result of the respective block.

20. The non-transitory computer-readable storage medium of claim 17, wherein the processing device is to perform further operations comprising:
  responsive to determining that the first voltage bin does not match the second voltage bin:
    scanning a third block at a predetermined location within the first block segment;
    identifying, based on scanning of the third block, a third voltage bin associated with the third block; and
    responsive to determining that the first voltage bin matches the third voltage bin, assigning the first voltage bin to each block of a second subset of the sorted plurality of blocks, wherein the second subset of blocks is located between the first boundary of the first block segments and a predetermined location within the first block segment.

* * * * *